United States Patent
Valero-Lopez

(10) Patent No.: US 7,583,153 B1
(45) Date of Patent: Sep. 1, 2009

(54) SYSTEMS AND METHODS FOR MULTIPLEXING MULTIPHASE CLOCKS

(75) Inventor: Ari Valero-Lopez, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 45 days.

(21) Appl. No.: 12/039,009

(22) Filed: Feb. 28, 2008

(51) Int. Cl.
*H03B 28/00* (2006.01)
*H03K 3/00* (2006.01)

(52) U.S. Cl. .................. 331/49; 331/45; 327/291

(58) Field of Classification Search .............. 331/45, 331/46, 49; 327/291–299
See application file for complete search history.

(56) References Cited

U.S. PATENT DOCUMENTS

| | | | |
|---|---|---|---|
| 5,406,427 A | 4/1995 | Shimoda | |
| 5,485,127 A | 1/1996 | Bertoluzzi et al. | |
| 5,654,657 A | 8/1997 | Pearce | |
| 5,687,325 A | 11/1997 | Chang | |
| 5,710,517 A | 1/1998 | Meyer | |
| 5,774,701 A | 6/1998 | Matsui et al. | |
| 6,100,732 A | 8/2000 | Penry et al. | |
| 6,876,710 B1 | 4/2005 | Pitzer et al. | |
| 7,102,391 B1 | 9/2006 | Sun et al. | |
| 7,176,727 B2* | 2/2007 | Kodama | 327/105 |
| 7,298,178 B1 | 11/2007 | Sun et al. | |

* cited by examiner

*Primary Examiner*—David Mis
(74) *Attorney, Agent, or Firm*—Hamilton, DeSanctis & Cha

(57) ABSTRACT

Various embodiments of the present invention provide systems, circuits and methods that allow for switching between two or more multiphase clocks. As one example, a system for switching between multiphase clocks is disclosed. The system includes a multiphase clock multiplexer. The multiphase clock multiplexer receives a first multiphase clock and a second multiphase clock. The first multiphase clock includes at least a first phase clock and a second phase clock, and the second multiphase clock includes at least a third phase clock and a fourth phase clock. The multiphase clock multiplexer receives a select signal, and is operable to output a first output corresponding to the first phase clock when the select signal is at a first assertion and corresponding to the third phase clock when the select signal is at a second assertion, and to output a second output corresponding to the second phase clock when the select signal is at the first assertion and corresponding to the fourth phase clock when the select signal is at the second assertion.

20 Claims, 5 Drawing Sheets

SYSTEMS AND METHODS FOR MULTIPLEXING MULTIPHASE CLOCKS

BACKGROUND OF THE INVENTION

The present invention is related to systems and methods for clocking a semiconductor device, and more particularly to systems and methods involving a multiphase clock.

Various semiconductor devices utilize a synchronous clock multiplexer circuit that allows for switching two synchronous clocks without incurring a glitch. A glitch is a high frequency pulse that may be recognized as a clock by some devices and not by others and often results in a circuit malfunction. A typical synchronous clock multiplexer utilizes one or more select signals to cause a switch between different input clocks.

Turning to FIG. 1, a prior art clock generation circuit 100 is depicted. Clock generation circuit 100 provides an ability to switch between two different clock inputs (i.e., clock 151 and clock 153) through use of a select line (i.e., select 101 and select_not 103) without incurring a glitch. An inverted version of clock 151 drives the clock inputs of data latch 113 and data latch 117, and clock 151 drives one input of a NAND gate 121. An inverted version of clock 153 drives the clock inputs of data latch 115 and data latch 119, and clock 153 drives one input of a NAND gate 123. Select 101 drives one input of an AND gate 107, and the output of data latch 117 is inverted and drives the other input of AND gate 107. Select_not 103 drives one input of an AND gate 105, and the output of data latch 119 is inverted and drives the other input of AND gate 107. The output of data latch 117 drives an input of NAND gate 121, and the output of data latch 119 drives an input of NAND gate 123. The output of NAND gate 121 and the output of NAND gate 123 drive the inputs of a NAND gate 125. NAND gate 125 drives a clock output signal 160.

In operation, clock 151 is selected to drive clock output signal 160 whenever select_not 103 is asserted high, and clock 153 is selected to drive clock output signal 160 whenever select 101 is asserted high. By feeding the output of data latch 117 back to gate select 101 and the output of data latch 119 back to gate select_not 101, any glitches on clock output signal 160 are avoided. In summary, for a selected clock to be multiplexed three steps occur sequentially: (1) select 101 and select_not 103 changes state indicating a clock multiplexing, (2) the change in select 101 and select_not 103 is clocked through respective data latches 113, 115, 117, 119 and the deselected clock is stopped, and (3) the signal that stops the clock is sampled and the selected clock enabled.

In some cases, the architecture described in FIG. 1 is extended to multiplex multiple clock phases. However, while such an extension is possible, switching between multiphase clock inputs can result in a different number of clocks being produced in one phase than in another. Where, where the multiphase clocks are used to drive differential clock inputs, the different numbers of clocks results in situation where only one side of a differential input is provided. In some cases, a different number of clocks occurring in one phase and not another may result in a circuit malfunction. In some cases, such circuit malfunctions cause irrecoverable losses of data. As one example, such a circuit may produce a misalignment in data pipes for a given design when a switch between clocks occurs. To avoid such a malfunction, the relevant pipes must be emptied and refilled. Such a process is time consuming and undesirable.

Hence, for at least the aforementioned reasons, there exists a need in the art for advanced systems and methods for circuit clocking.

BRIEF SUMMARY OF THE INVENTION

The present invention is related to systems and methods for clocking a semiconductor device, and more particularly to systems and methods involving a multiphase clock.

Various embodiments of the present invention provide multiphase synchronous clock multiplexer circuits. Such circuits include a first multiphase clock and a second multiphase clock. The first multiphase clock includes at least a first phase clock, a second phase clock, a third phase clock and a fourth phase clock; and the second multiphase clock includes at least a fifth phase clock, a sixth phase clock, a seventh phase clock and an eighth phase clock. The circuits also include a select signal synchronizing circuit that receives a select input and synchronizes the select input to either the fourth phase clock or the eighth phase clock to generate a first select output depending upon an assertion level of the first select output. In addition, the select signal synchronizing circuit receives a second select output and synchronizes the second select output to the fifth phase clock to generate a fourth select output; and receives a third select output and synchronizes the third select output to the first phase clock to generate a fifth select output. The circuit also includes a first multiplexing block and a second multiplexing block. The first multiplexing block receives the first phase clock, the second phase clock, the fifth phase clock and the sixth phase clock; and provides a first multiphase output including a combination of the first phase clock and the second phase clock or a combination of the fifth phase clock and the sixth phase clock depending upon a combination of the first select output, the fourth select output and the fifth select output. The second multiplexing block receives the third phase clock, the fourth phase clock, the seventh phase clock and the eighth phase clock; and provides a second multiphase output including a combination of the third phase clock and the fourth phase clock or a combination of the seventh phase clock and the eighth phase clock depending upon a combination of the first select output, the fourth select output and the fifth select output. Further, the second multiplexing block generates the second select output and the third select output based at least in part on the first select output.

In one particular instance of the aforementioned embodiments, the first multiplexing block logically combines the first select output with the fifth select output to generate a first combined select output; and synchronizes the first combined select output with the second phase clock to generate a first clock enable. Further, the first multiplexing block logically combines the first select output with the fourth select output to generate a second combined select output; and synchronizes the second combined select output with the sixth phase clock to generate a second clock enable. In such cases, the combination of the first clock enable and the second clock enable governs selection of the combination of the first phase clock and the second phase clock or the combination of the fifth phase clock and the sixth phase clock to drive the first multiphase output.

In various instance of the aforementioned embodiments, the second multiplexing block logically combines the first select output with the fifth select output to generate a first combined select output; and synchronizes the first combined select output with the second phase clock to generate a first clock enable. Further, the second multiplexing block logically combines the first select output with the fourth select output to generate a second combined select output; and synchronizes the second combined select output with the sixth phase clock to generate a second clock enable. In such cases, the combination of the first clock enable and the second clock enable governs selection of the combination of the third phase clock and the fourth phase clock or the combination of the seventh phase clock and the eighth phase clock to drive the second multiphase output. Further, the second select output is a derivative of the first clock enable, and the third select output is a derivative of the second clock enable.

In one or more instances of the aforementioned embodiments, the first phase clock is a complement of the second phase clock, the third phase clock is a complement of the fourth phase clock, the fifth phase clock is a complement of the sixth phase clock, and the seventh phase clock is a complement of the eighth phase clock. In some instances of the aforementioned embodiments, upon a transition of the select signal from one assertion state to another assertion state, the following sequence of events occurs: (1) the first multiphase output de-asserts corresponding to a sequential de-assertion of the first phase clock and the second phase clock, (2) the second multiphase output de-asserts corresponding to a sequential de-assertion of the third phase clock and the fourth phase clock, (3) the first multiphase output asserts corresponding to a sequential assertion of the fifth phase clock and the sixth phase clock, and (4) the second multiphase output asserts corresponding to a sequential assertion of the seventh phase clock and the eighth phase clock.

In various instances of the aforementioned embodiments, the circuit further includes a first clock generator and a second clock generator. The first clock generator receives a first input clock operating at a first frequency and provides the first multiphase clock operating at the first frequency, and the second clock generator receives a second input clock operating at a second frequency and provides the second multiphase clock operating at the second frequency. In one particular case, the first clock generator generates a first set of eight phase clocks based on the first input clock and the second clock generator generates a second set of eight phase clocks based on the second input clock. The first set of eight phase clocks combine to form the first multiphase clock, and the second set of eight phase clocks combine to form the second multiphase clock. In such cases, the circuit is operable to sequentially and synchronously switch between the first multiphase clock and the second multiphase clock such that the same number of clock pulses are maintained at a combined multiphase output between the first set of eight phase clocks when selected to drive the multiphase output and between the second set of eight phase clocks when selected to drive the multiphase output.

Other embodiments of the present invention provide systems for switching between multiphase clocks. Such systems include a multiphase clock multiplexer. The multiphase clock multiplexer receives a first multiphase clock and a second multiphase clock. The first multiphase clock includes at least a first phase clock and a second phase clock, and the second multiphase clock includes at least a third phase clock and a fourth phase clock. The multiphase clock multiplexer receives a select signal, and is operable to output a first output corresponding to the first phase clock when the select signal is at a first assertion and corresponding to the third phase clock when the select signal is at a second assertion, and to output a second output corresponding to the second phase clock when the select signal is at the first assertion and corresponding to the fourth phase clock when the select signal is at the second assertion.

In some instances of the aforementioned embodiments, the first phase clock is a complement of the second phase clock, and the third phase clock is a complement of the fourth phase clock. In various instances of the aforementioned embodiments, upon a transition of the select signal from the first assertion to the second assertion, the following sequence of events occurs: (1) the first output de-asserts corresponding to a de-assertion of the first phase clock, (2) the second output de-asserts corresponding to a de-assertion of the second phase clock, (3) the first output asserts corresponding to an assertion of the third phase clock, and (4) the second output asserts corresponding to an assertion of the fourth phase clock. In some such cases, the first phase clock is not a complement of the second phase clock, and the third phase clock is not a complement of the fourth phase clock.

In one or more instances of the aforementioned embodiments, the systems further include a first clock generator and a second clock generator. The first clock generator receives a first input clock operating at a first frequency and provides the first multiphase clock operating at the first frequency, and the second clock generator receives a second input clock operating at a second frequency and provides the second multiphase clock operating at the second frequency. In particular cases, the first input clock is asynchronous to the second input clock.

In various instances of the aforementioned embodiments, the first multiphase clock includes a first set of eight different phase clocks, and the second multiphase clock includes a second set of eight different phase clocks. The multiphase clock multiplexer is operable to provide a multiphase output corresponding to the first set of eight different phase clocks when the select signal is at the first assertion and corresponding to the second set of eight different phase clocks when the select signal is at the second assertion.

Yet other embodiments of the present invention provide methods for switching between two multiphase clocks. Such methods include receiving a first multiphase clock and a second multiphase clock. The first multiphase clock includes at least a first phase clock and a second phase clock, and the second multiphase clock includes at least a third phase clock and a fourth phase clock. The methods further include transitioning a select signal from a first assertion to a second assertion. Based at least in part on the select signal, a multiphase output is transitioned from a signal set corresponding to the first multiphase clock to a signal set corresponding to the second multiphase clock. Such a transition assures that the same number of clock pulses are maintained at the multiphase output between the first phase clock and the second phase clock, and that the same number of clock pulses are maintained between the third phase clock and the fourth phase clock.

In various instances of the aforementioned embodiments, transitioning the multiphase output includes performing the following sequence: de-asserting the multiphase output corresponding to de-assertion of respective members of the signal set corresponding to the first multiphase clock; and subsequently, asserting the multiphase output corresponding to assertion of respective members of the signal set corresponding to the second multiphase clock.

In some cases, the methods further include receiving a first input clock and a second input clock that are asynchronous to each other. The first multiphase clock is generated based on the first input clock, and the second multiphase clock is generated based on the second input clock. In one particular case, the first multiphase clock includes a first set of eight different phase clocks, and the second multiphase clock includes a second set of eight different phase clocks. In such cases, the multiphase clock multiplexer is operable to provide a multiphase output corresponding to the first set of eight different phase clocks when the select signal is at the first assertion and corresponding to the second set of eight different phase clocks when the select signal is at the second assertion.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for clocking a semiconductor device, and more particularly to systems and methods involving a multiphase clock.

Figure 1:
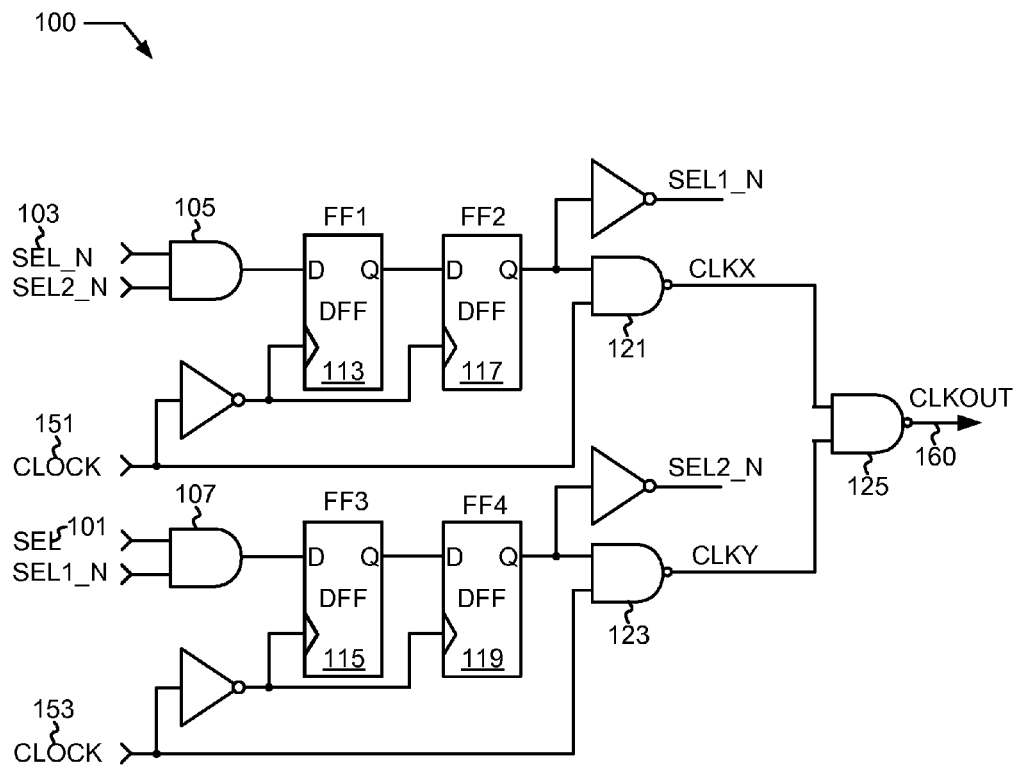
FIG. 1 depicts a prior art synchronous clock multiplexer.
Figure 2:
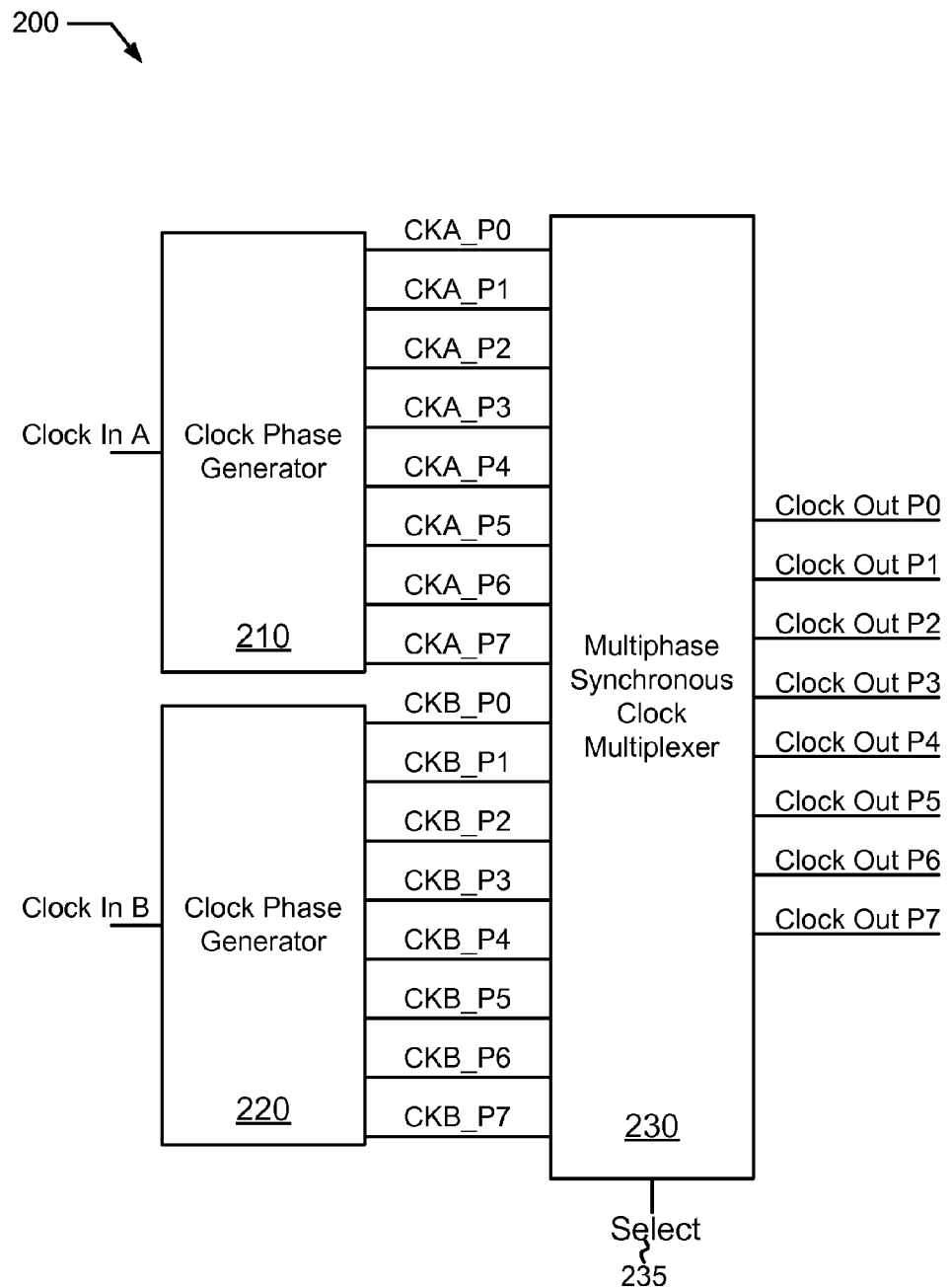
FIG. 2 depicts a multiphase clock generator and multiplexer system in accordance with various embodiments of the present invention.

Turning to FIG. 2, a multiphase clock generator and multiplexer system 200 is depicted in accordance with various embodiments of the present invention. Multiphase clock generator and multiplexer system 200 includes two clock phase generators 210, 220. Clock phase generator 210 receives a Clock In A signal. Clock In A is a periodic signal exhibiting a particular frequency range and duty cycle range. Based on Clock In A, clock phase generator 210 generates eight output clock signals each phase shifted relative to Clock In A. In particular, CKA_P0 is phase shifted zero (0) degrees from Clock In A, CKA_P1 is phase shifted forty-five (45) degrees from Clock In A, CKA_P2 is phase shifted ninety (90) degrees from Clock In A, CKA_P3 is phase shifted one hundred, thirty-five (135) degrees from Clock In A, CKA_P4 is phase shifted one hundred, eighty (180) degrees from Clock In A, CKA_P5 is phase shifted two hundred, twenty-five (225) degrees from Clock In A, CKA_P6 is phase shifted two hundred, seventy (270) degrees from Clock In A, and CKA_P7 is phase shifted three hundred, fifteen (315) degrees from Clock In A. Clock phase generator 210 may be any circuit known in the art that is capable of generating multiple phases of an input clock. Based upon the disclosure provided herein, one of ordinary skill in the art will recognize a variety of phase generator circuits that may be used in accordance with different embodiments of the present invention, and will recognize that more or fewer than eight phases may be generated depending upon the particular embodiment of the present invention.

Similarly, clock phase generator 220 receives a Clock In B signal. Clock In B is a periodic signal exhibiting a particular frequency range and duty cycle range. Based on Clock In B, clock phase generator 220 generates eight output clock signals each phase shifted relative to Clock In B. In particular, CKB_P0 is phase shifted zero (0) degrees from Clock In B, CKB_P1 is phase shifted forty-five (45) degrees from Clock In B, CKB_P2 is phase shifted ninety (90) degrees from Clock In B, CKB_P3 is phase shifted one hundred, thirty-five (135) degrees from Clock In B, CKB_P4 is phase shifted one hundred, eighty (180) degrees from Clock In B, CKB_P5 is phase shifted two hundred, twenty-five (225) degrees from Clock In B, CKB_P6 is phase shifted two hundred, seventy (270) degrees from Clock In B, and CKB_P7 is phase shifted three hundred, fifteen (315) degrees from Clock In B. Clock phase generator 220 may be any circuit known in the art that is capable of generating multiple phases of an input clock. Based upon the disclosure provided herein, one of ordinary skill in the art will recognize a variety of phase generator circuits that may be used in accordance with different embodiments of the present invention, and will recognize that more or fewer than eight phases may be generated depending upon the particular embodiment of the present invention.

A multiphase synchronous clock multiplexer 230 receives the clock phases from each of clock phase generator 210 and clock phase generator 220 and outputs one or the other set of clock phases based on a select input 235. In particular, based on the assertion level of select input 235, a Clock Out P0 is selected to either be CKA_P0 or CKB_P0, a Clock Out P1 is selected to either be CKA_P1 or CKB_P1, a Clock Out P2 is selected to either be CKA_P2 or CKB_P2, a Clock Out P3 is selected to either be CKA_P3 or CKB_P3, a Clock Out P4 is selected to either be CKA_P4 or CKB_P4, a Clock Out P5 is selected to either be CKA_P5 or CKB_P5, a Clock Out P6 is selected to either be CKA_P6 or CKB_P6, and a Clock Out P7 is selected to either be CKA_P7 or CKB_P7. Multiphase synchronous clock multiplexer 230 assures a glitch-less transition between one set of clock phases to the other upon a change in select input 235. In addition, multiphase synchronous clock multiplexer 230 controls the sequencing of the turn on and turn off of the selected clock phases to assure that the same number of clocks are provided for each phase. Such an approach assures that the stage receiving the outputs from multiphase synchronous clock multiplexer 230 always gets proper complementary and sequential clocks. In some cases, multiphase synchronous clock multiplexer 230 provides the aforementioned synchronizing and glitch control by using the enable signal of negative differential signals to generate differential outputs and synchronizing the enable/disable signal to sequentially turn off the deselected clock and then sequentially turn on the enabled clock.

Figure 3:
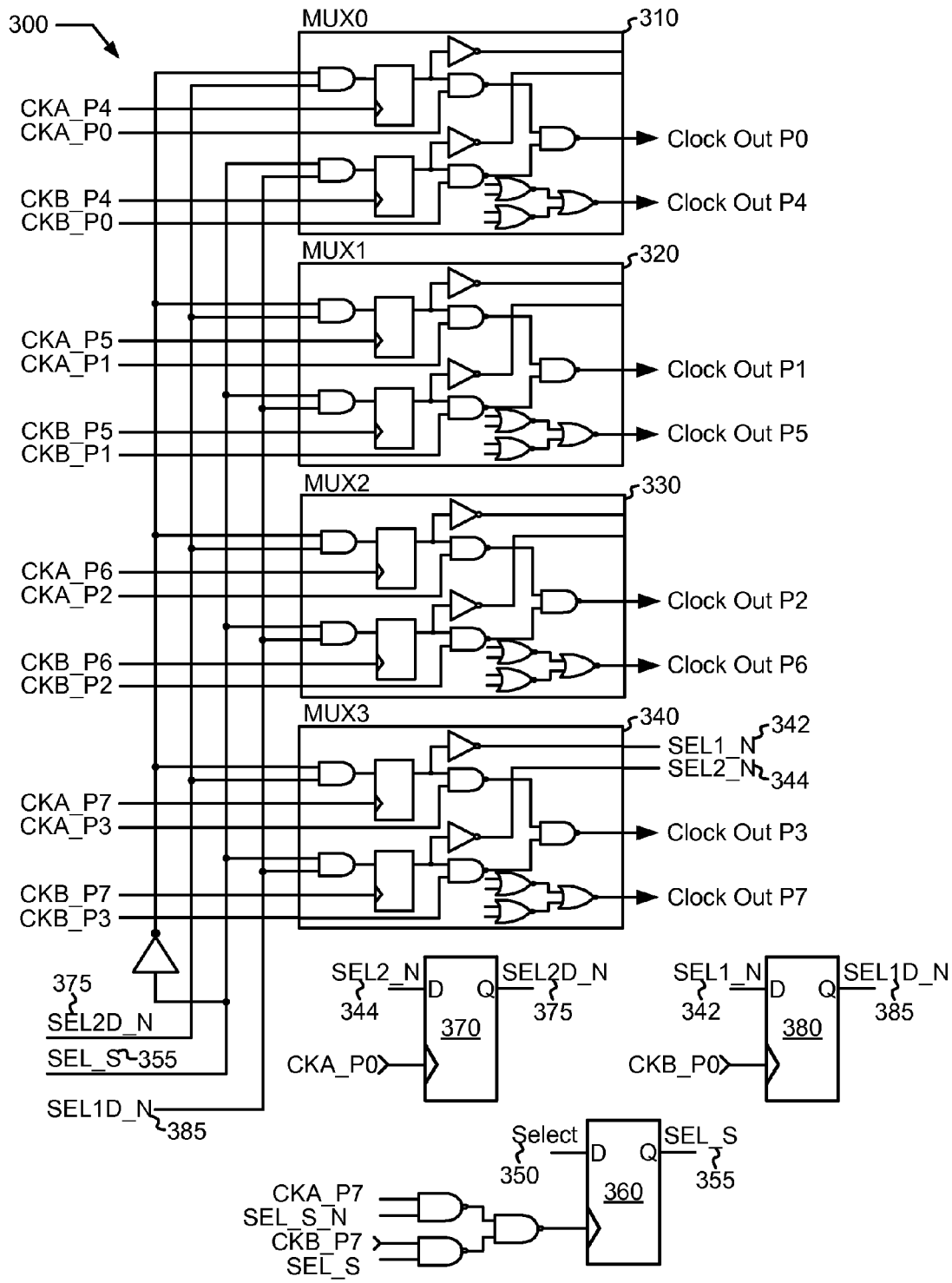
FIG. 3 depicts a multiphase synchronous clock multiplexer in accordance with various embodiments of the present invention.

Turning to FIG. 3, a multiphase synchronous clock multiplexer 300 is shown in accordance with various embodiments of the present invention. Multiphase synchronous clock multiplexer 300 may be used in place of multiphase synchronous clock multiplexer 230 of FIG. 2. As shown, multiphase synchronous clock multiplexer 300 provides the ability to switch between two sets of clock phase signals that are each eight phases. Based on the disclosure provided herein, one of ordinary skill in the art will recognize various modifications that may be made such that a different number of phases may be switched. Further, while the depicted circuit provides for switching between two sets of clock phases, based on the disclosure provided herein, one of ordinary skill in the art will recognize that the circuit may be expanded to allow for switching between three or more sets of clock phases. As shown, the circuit requires only eleven D type flip flops and forty-two logic gates. As just some advantages, one or more embodiments of the present invention may exhibit a relatively small number of flip flops and logic gates resulting in a small die area and power consumption, the ability to rely on non-complimentary clocks even during the clock switching time, a controlled sequencing of clock phases during switching time, and/or an ability to multiplex multiphase clocks that are operating at high frequencies.

Multiphase synchronous clock multiplexer 300 includes four multiplexing blocks 310, 320, 330, 340 that each include the same circuitry. It should be noted that some of the circuitry in multiplexing blocks 310, 320, 330 is not used and therefore could be eliminated if desired. The particular details of multiplexing blocks 310, 320, 330, 340 are discussed below in relation to FIG. 4. Multiplexing block 310 receives two phase of one input clock and two clock phases of another input clock. In particular, multiplexing block 310 receives CKA_P0 and CKA_P4, and CKB_P0 and CKB_P4. Based on an input select signal 350 multiplexing block 310 provides Clock Out P0 that is either based on CKA_P0 or CKB_P0, and Clock Out P4 that is either based on CKA_P4 or CKB_P4. Similarly, multiplexing block 320 receives two phase of one input clock and two clock phases of another input clock. In particular, multiplexing block 320 receives CKA_P1 and CKA_P5, and CKB_P1 and CKB_P5. Based on input select signal 350 multiplexing block 320 provides Clock Out P1 that is either based on CKA_P1 or CKB_P1, and Clock Out P5 that is either based on CKA_P5 or CKB_P5. Multiplexing block 330 receives two phase of one input clock and two clock phases of another input clock. In particular, multiplexing block 330 receives CKA_P2 and CKA_P6, and CKB_P2 and CKB_P6. Based on input select signal 350 multiplexing block 330 provides Clock Out P2 that is either based on CKA_P2 or CKB_P2, and Clock Out P6 that is either based on CKA_P6 or CKB_P6. Multiplexing block 340 receives two phase of one input clock and two clock phases of another input clock. In particular, multiplexing block 340 receives CKA_P3 and CKA_P7, and CKB_P3 and CKB_P7. Based on input select signal 350 multiplexing block 340 provides Clock Out P3 that is either based on CKA_P3 or CKB_P3, and Clock Out P7 that is either based on CKA_P7 or CKB_P7. In addition, multiplexer 340 provides a select output 342 and a select output 344 that indicate which of the clock input sets are currently selected by multiplexing block 340. As more fully discussed below, select inputs 342, 344 are used to control the sequencing of the provided clock outputs during a transition of select input 350.

In one particular embodiment of the present invention, the phase sets (i.e., CKA_P0 and CKA_P4, CKB_P0 and CKB_P4, CKA_P1 and CKA_P5, CKB_P1 and CKB_P5, CKA_P2 and CKA_P6, CKB_P2 and CKB_P6, CKA_P3 and CKA_P7, and CKB_P0 and CKB_P7) received by each of multiplexer blocks 310, 320, 330, 340 are complimentary with one phase being one-hundred, eighty degrees (180) out of phase from the other phase. In other embodiments, the phase sets are not necessarily complementary but are sufficiently out of phase to assure glitch-less operation of multiplexer blocks 310, 320, 330, 340.

Multiphase synchronous clock multiplexer 300 additionally includes three flip flops 360, 370, 380 that are used to control clock output sequencing. In particular, the data input of flip flop 360 is driven by select input 350, and the clock input is driven by either CKA_P7 or CKB_P7 depending upon a select output 355 of flip flop 360. In particular, the clock that samples the select signal is the same clock that is selected at the output. Select output 342 is provided at the data input of flip flop 380 that is clocked by CKB_P0. The output of flip flop 380 is a select output 385. Select output 344 is provided at the data input of flip flop 370 that is clocked by CKA_P0. The output of flip flop 370 is a select output 375.

Figure 4:
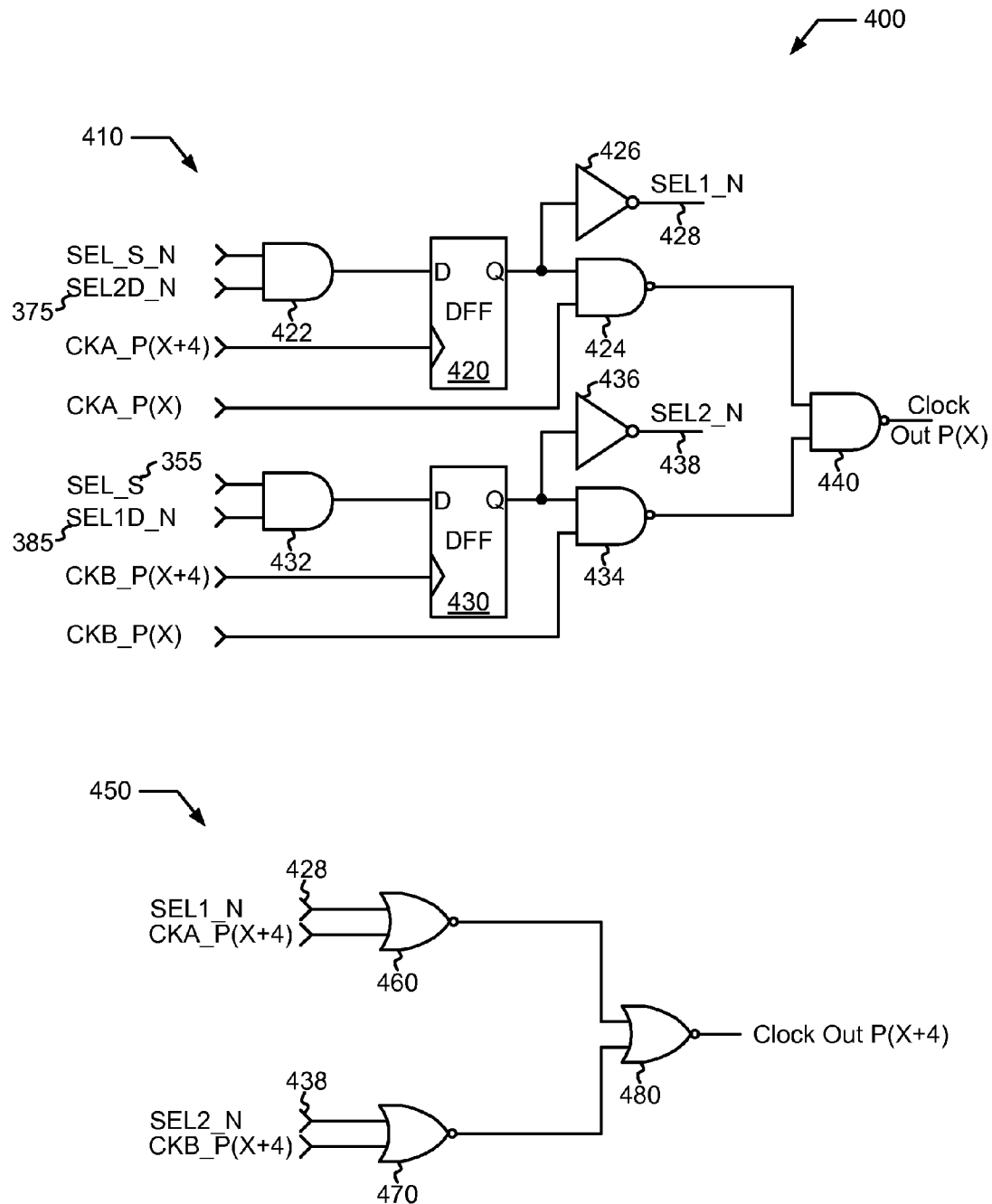
FIG. 4 provides a detailed view of a multiplexing block that may be used to implement the multiphase synchronous clock multiplexer of FIG. 3 in accordance with some embodiments of the present invention.

Turning to FIG. 4, a detailed view of a multiplexing block 400 is provided. Multiplexing block 400 may be used in place of any of multiplexing blocks 310, 320, 330, 340 of FIG. 3. As shown, multiplexing block 400 includes a multiplexing circuit 410 and a complement circuit 450. Multiplexing circuit 410 receives a CKA_P(X) and a CKA_P(X+4), and a CKB_P(X) and a CKB_P(X+4). In some cases, CKA_P(X+4) is a complement of CKA_P(X), and CKB_P(X+4) is a complement of CKB_P(X). CKA_P(X+4) clocks a flip flop 420, and CKB_P(X+4) clocks a flip flop 430. The data input of flip flop 420 is driven by an AND gate 422 that logically ANDs an inverted version of select output 355 with select output 375. The data input of flip flop 430 is driven by an AND gate 432 that logically ANDs select output 355 with select output 385. The output of flip flop 420 is inverted via an inverter 426 to provide a select output 428, and the output of flip flop 430 is inverted via an inverter 436 to provide a select output 438. The output of flip flop 420 is also applied to a NAND gate 424 that logically NANDs it with CKA_P(X), and the output of flip flop 430 is also applied to a NAND gate 434 that logically NANDs it with CKB_P(X). The outputs of NAND gate 424 and NAND gate 434 are applied to a NAND gate that logically NANDs the signals and drives a Clock Out P(X) signal.

Complement circuit 450 includes a NOR gate 460 that logically NORs select output 428 with CKA_P(X+4), and a NOR gate 470 that logically NORs select output 438 with CKB_P(X+4). The outputs of NOR gate 460 and NOR gate 470 are applied to a NOR gate 480 that that logically NORs the signals and drives a Clock Out P(X+4) signal. In some cases, Clock Out P(X+4) is a complement of Clock Out P(X).

Figure 5:
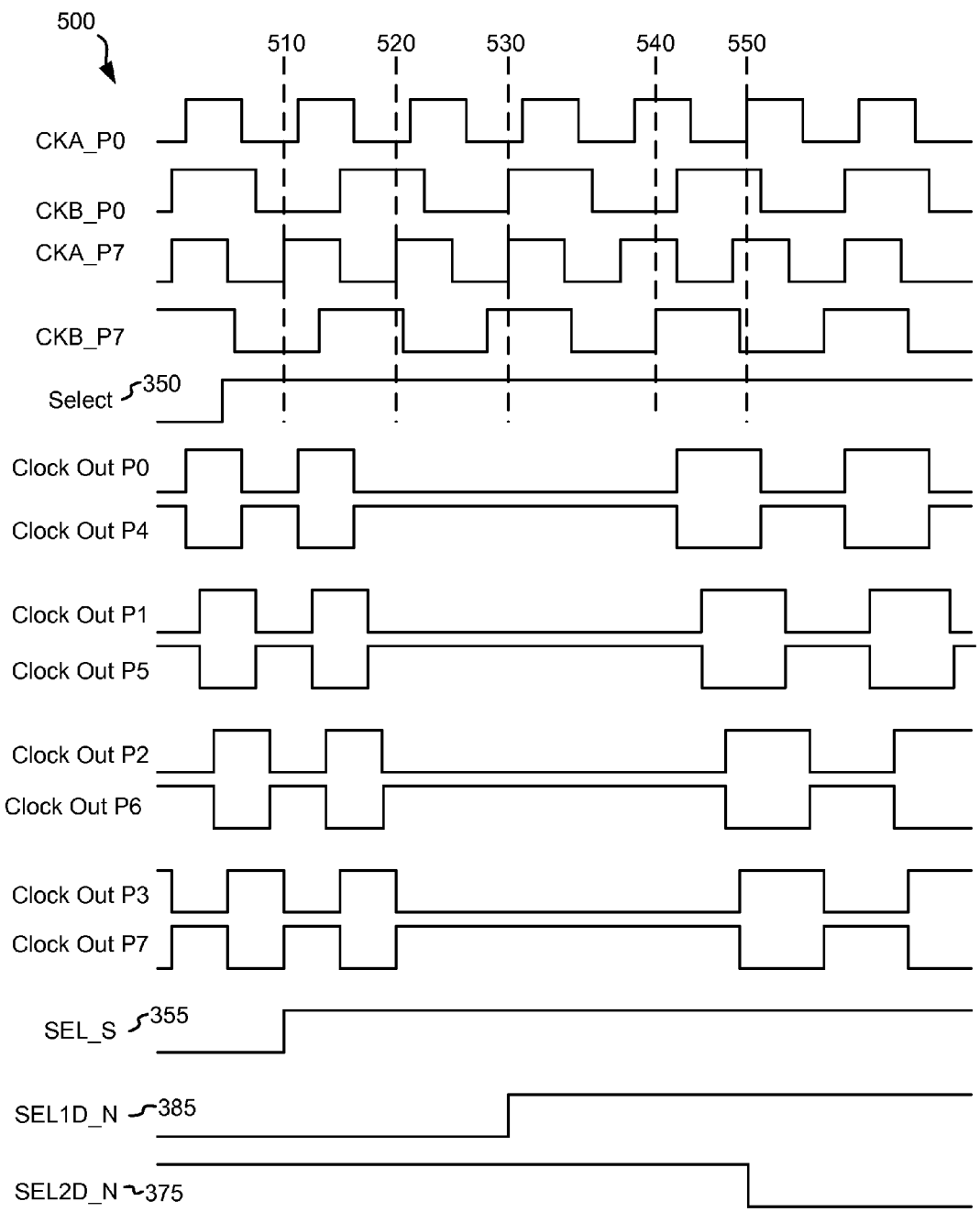
FIG. 5 is a timing diagram depicting an exemplary operation of the multiphase synchronous clock multiplexer of FIG. 3.

In operation, two sets of eight clock phases are generated and applied to multiphase synchronous clock multiplexer 300 which selects one of the sets of eight clock phases to drive as an output. Turning to FIG. 5, a timing diagram 500 depicts an exemplary operation of multiphase synchronous clock multiplexer 300. For simplicity, the only clock inputs that are shown are CKA_P0, CKA_P7, CKB_P0 and CKB_P7. As shown, CKA_XX has a frequency that is substantially different than that of CKB_XX. Select input 350 is originally asserted low causing select output 355 to be asserted low, select output 385 to be asserted low, and select output 375 to be asserted high. In this condition, multiplexing block 310 drives Clock Out P0 based on CKA_P0, and Clock Out P4 based on CKA_P4 (not shown); multiplexing block 320 drives Clock Out P1 based on CKA_P1 (not shown), and Clock Out P5 based on CKA_P5 (not shown); multiplexing block 330 drives Clock Out P2 based on CKA_P2 (not shown), and Clock Out P6 based on CKA_P6 (not shown); and multiplexing block 340 drives Clock Out P3 based on CKA_P3 (not shown), and Clock Out P7 based on CKA_P7.

Select input 350 transitions from a low assertion state to a high assertion state. After the transition, select output 355 transitions from low to high on the next rising edge of CKA_P7 as shown by a dashed line 510. While not shown, a high to low transition of select input 350 will result in a high to low transition of select output 355 on the next rising edge of CKA_P7. The transition of select output 355 causes select output 342 (not shown) to transition from low to high on the next rising edge of CKA_P7 as indicated by a dashed line 520, and subsequently causes select output 385 to transition from low to high on a rising edge of CKB_P0 as indicated by a dashed line 530. In addition, the transition of select output 355 causes select output 344 (not shown) to transition from high to low on a rising edge of CKB_P7 as indicated by a dashed line 540, and subsequently causes select output 375 to transition from high to low on a rising edge of CKA_P0 as indicated by a dashed line 550. As the clock outputs are each controlled by a paired clock of a different phase, the clock outputs turn off sequentially. In this case, Clock Out P0 turns off first and is always matched with Clock Output P4. Subsequently, Clock Out P1 turns off and is always matched with Clock Output P5. Then, Clock Out P2 turns off and is always matched with Clock Output P6, followed by Clock Out P3 turning off while always being matched with Clock Out P7.

With select output 355 and select output 385 transitioned, the clock outputs are ready to be driven by the newly selected clock inputs. In the same manner that each of the clock outputs turned off sequentially, they are turned on sequentially. In this case, Clock Out P0 is turned on corresponding to the next rising edge of CKB_P4 (not shown) and Clock Out P4 is always matched thereto. Subsequently, Clock Out P1 is turned on corresponding to the next rising edge of CKB_P5 (not shown) and Clock Out P5 is always matched thereto. Then, Clock Out P2 is turned on corresponding to the next rising edge of CKB_P6 (not shown) and Clock Out P6 is always matched thereto, and finally Clock Out P3 is turned on corresponding to the next rising edge of CKB_P7 and Clock Out P7 is always matched thereto.

In general, the following steps cover the process of transitioning between multiphase clocks: (A) the select signal (e.g., select input 350) is transitioned to select a desired multiphase clock; (B) the transitioned select signal is sampled (e.g., select output 355) and sent to all multiplexing blocks (e.g., multiplexing blocks 310, 320, 330, 340); (C) the earliest phase of the deselected clock is stopped, followed sequentially by the later phases; select output signals generated by the highest order multiplexing block (e.g., select outputs 342, 344 of multiplexing block 340) transition indicating that all phases have been stopped; (D) elect output signals generated by the highest order multiplexing block (e.g., select outputs 342, 344 of multiplexing block 340) are synchronized with the selected clock to enable the new clock; and (E) the earliest phase of the selected clock is enabled, followed sequentially by the later phases.

In conclusion, the invention provides novel systems, circuits, methods and arrangements for producing a multiphase signal. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A multiphase synchronous clock multiplexer circuit, the circuit comprising:
  a first multiphase clock, wherein the first multiphase clock includes at least a first phase clock, a second phase clock, a third phase clock and a fourth phase clock;
  a second multiphase clock, wherein the second multiphase clock includes at least a fifth phase clock, a sixth phase clock, a seventh phase clock and an eighth phase clock;
  a select signal synchronizing circuit, wherein the select signal synchronizing circuit receives a select input and synchronizes the select input to either the fourth phase clock or the eighth phase clock to generate a first select output depending upon an assertion level of the first select output; wherein the select signal synchronizing circuit receives a second select output and synchronizes the second select output to the fifth phase clock to generate a fourth select output; and wherein the select signal synchronizing circuit receives a third select output and synchronizes the third select output to the first phase clock to generate a fifth select output;
  a first multiplexing block, wherein the first multiplexing block receives the first phase clock, the second phase clock, the fifth phase clock and the sixth phase clock; and wherein the first multiplexing block provides a first multiphase output including a combination of the first phase clock and the second phase clock or a combination of the fifth phase clock and the sixth phase clock depending upon a combination of the first select output, the fourth select output and the fifth select output; and
  a second multiplexing block, wherein the second multiplexing block receives the third phase clock, the fourth phase clock, the seventh phase clock and the eighth phase clock; wherein the second multiplexing block provides a second multiphase output including a combination of the third phase clock and the fourth phase clock or a combination of the seventh phase clock and the eighth phase clock depending upon a combination of the first select output, the fourth select output and the fifth select output; and wherein the second multiplexing block generates the second select output and the third select output based at least in part on the first select output.

2. The circuit of claim 1, wherein:
  the first multiplexing block logically combines the first select output with the fifth select output to generate a first combined select output;
  the first multiplexing block synchronizes the first combined select output with the second phase clock to generate a first clock enable;
  the first multiplexing block logically combines the first select output with the fourth select output to generate a second combined select output;
  the first multiplexing block synchronizes the second combined select output with the sixth phase clock to generate a second clock enable; and
  the combination of the first clock enable and the second clock enable governs selection of the combination of the first phase clock and the second phase clock or the combination of the fifth phase clock and the sixth phase clock to drive the first multiphase output.

3. The circuit of claim 1, wherein:
  the second multiplexing block logically combines the first select output with the fifth select output to generate a first combined select output;
  the second multiplexing block synchronizes the first combined select output with the third phase clock to generate a first clock enable, and wherein the second select output is a derivative of the first clock enable;
  the second multiplexing block logically combines the first select output with the fourth select output to generate a second combined select output;
  the second multiplexing block synchronizes the second combined select output with the seventh phase clock to generate a second clock enable, and wherein the third select output is a derivative of the second clock enable; and
  the combination of the first clock enable and the second clock enable governs selection of the combination of the third phase clock and the fourth phase clock or the combination of the seventh phase clock and the eighth phase clock to drive the second multiphase output.

4. The circuit of claim 1, wherein the first phase clock is a complement of the second phase clock, the third phase clock is a complement of the fourth phase clock, the fifth phase clock is a complement of the sixth phase clock, and the seventh phase clock is a complement of the eighth phase clock.

5. The circuit of claim 1, wherein upon a transition of the select signal from one assertion state to another assertion state, the following sequence of events occurs: (1) the first multiphase output de-asserts corresponding to a sequential de-assertion of the first phase clock and the second phase clock, (2) the second multiphase output de-asserts corresponding to a sequential de-assertion of the third phase clock and the fourth phase clock, (3) the first multiphase output asserts corresponding to a sequential assertion of the fifth phase clock and the sixth phase clock, and (4) the second multiphase output asserts corresponding to a sequential assertion of the seventh phase clock and the eighth phase clock.

6. The circuit of claim 1, wherein the circuit further comprises:
a first clock generator, wherein the first clock generator receives a first input clock operating at a first frequency and provides the first multiphase clock operating at the first frequency; and
a second clock generator, wherein the second clock generator receives a second input clock operating at a second frequency and provides the second multiphase clock operating at the second frequency.

7. The circuit of claim 6, wherein:
the first clock generator generates a first set of eight phase clocks based on the first input clock, and wherein the first set of eight phase clocks combine to form the first multiphase clock;
the second clock generator generates a second set of eight phase clocks based on the second input clock, and wherein the second set of eight phase clocks combine to form the second multiphase clock; and
wherein the circuit is operable to sequentially and synchronously switch between the first multiphase clock and the second multiphase clock such that the same number of clock pulses are maintained at a combined multiphase output between the first set of eight phase clocks when selected to drive the multiphase output and between the second set of eight phase clocks when selected to drive the multiphase output.

8. A system for switching between multiphase clocks, the system comprising:
a multiphase clock multiplexer, wherein the multiphase clock multiplexer receives a first multiphase clock and a second multiphase clock, wherein the first multiphase clock includes at least a first phase clock and a second phase clock, wherein the second multiphase clock includes at least a third phase clock and a fourth phase clock, wherein the multiphase clock multiplexer receives a select signal, wherein the multiphase clock multiplexer is operable to output a first output corresponding to the first phase clock when the select signal is at a first assertion and corresponding to the third phase clock when the select signal is at a second assertion, and wherein the multiphase clock multiplexer is operable to output a second output corresponding to the second phase clock when the select signal is at the first assertion and corresponding to the fourth phase clock when the select signal is at the second assertion.

9. The system of claim 8, wherein the first phase clock is a complement of the second phase clock, and wherein the third phase clock is a complement of the fourth phase clock.

10. The system of claim 8, wherein upon a transition of the select signal from the first assertion to the second assertion, the following sequence of events occurs: (1) the first output de-asserts corresponding to a de-assertion of the first phase clock, (2) the second output de-asserts corresponding to a de-assertion of the second phase clock, (3) the first output asserts corresponding to an assertion of the third phase clock, and (4) the second output asserts corresponding to an assertion of the fourth phase clock.

11. The system of claim 10, wherein the first phase clock is not a complement of the second phase clock, and the third phase clock is not a complement of the fourth phase clock.

12. The system of claim 8, wherein the system further comprises:
a first clock generator, wherein the first clock generator receives a first input clock operating at a first frequency and provides the first multiphase clock operating at the first frequency; and
a second clock generator, wherein the second clock generator receives a second input clock operating at a second frequency and provides the second multiphase clock operating at the second frequency.

13. The system of claim 12, wherein the first input clock is asynchronous to the second input clock.

14. The system of claim 8, wherein the first multiphase clock includes a first set of eight different phase clocks, wherein the second multiphase clock includes a second set of eight different phase clocks, and wherein the multiphase clock multiplexer is operable to provide a multiphase output corresponding to the first set of eight different phase clocks when the select signal is at the first assertion and corresponding to the second set of eight different phase clocks when the select signal is at the second assertion.

15. A method for switching between two multiphase clocks, the method comprising:
receiving a first multiphase clock, wherein the first multiphase clock includes at least a first phase clock and a second phase clock;
receiving a second multiphase clock, wherein the second multiphase clock includes at least a third phase clock and a fourth phase clock;
transitioning a select signal from a first assertion to a second assertion; and
transitioning an multiphase output, wherein based at least in part on the select signal, the multiphase output is transitioned from a signal set corresponding to the first multiphase clock to a signal set corresponding to the second multiphase clock, wherein the same number of clock pulses are maintained at the multiphase output between the first phase clock and the second phase clock, and wherein the same number of clock pulses are maintained between the third phase clock and the fourth phase clock.

16. The method of claim 15, wherein the first phase clock is a complement of the second phase clock, wherein the third phase clock is a complement of the fourth phase clock, and wherein the complement of the first phase clock and the second phase clock and the complement of the third phase clock and the fourth phase clock are maintained at the multiphase output.

17. The method of claim 15, wherein transitioning the multiphase output includes performing the following sequence:
de-asserting the multiphase output corresponding to de-assertion of respective members of the signal set corresponding to the first multiphase clock; and
subsequently, asserting the multiphase output corresponding to assertion of respective members of the signal set corresponding to the second multiphase clock.

18. The method of claim 17, wherein the first phase clock is not a complement of the second phase clock, and the third phase clock is not a complement of the fourth phase clock.

19. The method of claim 15, wherein the method further comprises:
- receiving a first input clock;
- receiving a second input clock, wherein the second input clock is asynchronous to the first input clock;
- generating the first multiphase clock based on the first input clock; and
- generating the second multiphase clock based on the second input clock.

20. The method of claim 19, wherein the first multiphase clock includes a first set of eight different phase clocks, wherein the second multiphase clock includes a second set of eight different phase clocks, and wherein the multiphase clock multiplexer is operable to provide a multiphase output corresponding to the first set of eight different phase clocks when the select signal is at the first assertion and corresponding to the second set of eight different phase clocks when the select signal is at the second assertion.

* * * * *